INSULATED-GATE FIELD-EFFECT SEMICONDUCTOR DEVICE

Filed Nov. 25, 1964 4 Sheets-Sheet 1

INVENTOR.
NORMAN H. DITRICK
BY
[signature]
Attorney

INVENTOR.
NORMAN H. DITRICK
BY
Glenn H. Bruestle
Attorney

INVENTOR.
NORMAN H. DITRICK
BY
[signature]
Attorney

INVENTOR.
NORMAN H. DITRICK
BY
Glenn H. Bruestle
Attorney 3,305,708

INSULATED-GATE FIELD-EFFECT SEMICONDUCTOR DEVICE

Norman Harold Ditrick, Raritan, N.J., assignor to Radio Corporation of America, a corporation of Delaware
Filed Nov. 25, 1964, Ser. No. 413,839
6 Claims. (Cl. 317—234)

This invention relates to improved semiconductive devices. More particularly, the invention relates to improved insulated-gate field-effect semiconductor devices.

The type of semiconductor device in which the conductivity of a portion of a semiconductive wafer may be modulated by an applied electric field is known as a field-effect device. One kind of field-effect device has a dielectric or insulating layer over a portion of the surface of a crystalline semiconductive wafer, and has a control electrode deposited on this insulating layer. Units of this kind are known as insulated-gate field-effect devices, and may comprise: a wafer of crystalline semiconductive material; two spaced low-resistivity regions adjacent to one face of said wafer; a layer of insulating material on said one wafer face between said two spaced regions; two metallic electrodes bonded respectively to said two spaced regions; and a metallic control electrode on said insulating layer between said two spaced regions for controlling the conductivity of a "channel" between the two spaced regions.

One class of insulated gate device is known as the MOS (Metal Oxide Semiconductor) transistor, and is described, e.g., by S. R. Hofstein and F. P. Heiman in "The Silicon Insulated-Gate Field-Effect Transistor," Proceedings IEEE, volume 51, page 1190, September 1963. In devices of this type, the dielectric or insulating layer usually consists of silicon oxide; the metallic control electrode on the insulating layer is also known as the gate electrode; and the two electrodes bonded directly to the spaced low-resistivity regions of the semiconductive wafer are known as the source and drain electrodes.

Field-effect devices are majority charge carrier devices, and they may be made with either P-type or N-type majority charge carriers. It is desirable to fabricate field-effect devices with both P-type and N-type charge carriers on the same semiconductive wafer, but this has hitherto been difficult. It is also desirable to provide insulated-gate field-effect devices with an adjustable threshold voltage. It is also desirable to improve the stability and uniformly of the electrical characteristics of such devices.

An object of this invention is to provide improved semiconductor devices.

Another object of this invention is to provide improved insulated-gate field-effect devices.

A further object is to provide an improved field-effect semiconductor device having an adjustable threshold voltage.

An additional object is to provide improved insulated-gate field-effect devices having improved electrical characteristics.

These and other objects of the invention are accomplished by providing a semiconductor device comprising a crystalline substrate or body having at least one major face; first and second spaced low-resistivity regions in said semiconductive body immediately adjacent to said one major face; a low-resistivity zone or band in said body immediately adjacent to said one major face and surrounding the lateral periphery of one said spaced low-resistivity region; a layer of dielectric material on said one major face covering the gap between said first and second spaced low-resistivity regions; a metallic contact on said dielectric layer over the gap between said first and second spaced regions; and two metallic contacts to said first and second spaced regions respectively.

The invention and its features will be described in greater detail with reference to a number of examples, considered in conjunction with the accompanying drawing, in which.

Figure 1:
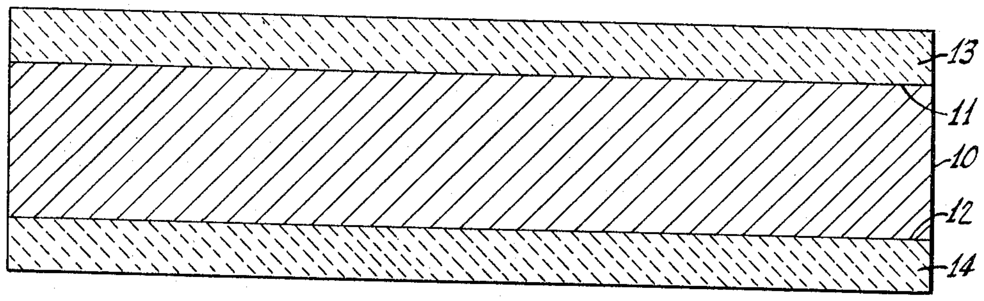
FIGURES 1–7 are cross-sectional elevational views of a semiconductive body, illustrating successive steps in the fabrication of a semiconductor device according to one embodiment of the invention.

Insulated-gate field effect transistors of the MOS class may be of two general types, one type being known as the depletion type, and the other as the enhancement type. In the enhancement type MOS transistor, there is essentially no flow of current in the semiconductive body between the source and drain regions when the voltage applied to the gate electrode is zero. As the gate bias is increased, charges of opposite polarity to that of the gate electrode are attracted to the face of the semiconductive body between the two spaced low-resistivity regions, and current then begins to flow between the two spaced regions. Although the invention will be described in terms of an enhancement type insulated-gate field-effect transistor, the invention may be applied to other types of semiconductor unipolar devices which have a dielectric layer on a crystalline semiconductive substrate.

*Example I*

A crystalline semiconductive body or wafer 10 (FIGURE 1) is prepared with at least one major face 11. The exact size, shape and conductivity of semiconductive body 10 is not critical. The semiconductive body 10 may consist of silicon, germanium, silicon-germanium alloys, and the like. Conveniently, the semiconductive body or wafer 10 is a die having two opposing major faces 11 and 12. In this example, the semiconductive die 10 is about 50 mils square, about 6 mils thick, consists of monocrystalline silicon, and is of P-type conductivity. The resistivity of die 10 is preferably at least one ohm-cm., that is, equal to or greater than 1 ohm-cm.

Immediately adjacent one major die face 11, two spaced low-resistivity regions of conductivity type opposite that of the wafer are formed by techniques known to the art such as by diffusion of a conductivity modifier through a mask into selected portions of die face 11. When the semiconductive wafer consists of silicon, as in this example, the diffusion mask may consist of silicon oxide coatings 13 and 14 formed on wafer faces 11 and 12 respectively by heating the wafer in steam for about 30 minutes at about 1050° C. The silicon oxide coatings 13 and 14 thus formed are about 2000 to 4000 Angstroms thick.

Using standard masking and etching techniques known to the semiconductor art, a pair of spaced openings 15 and 16 (FIGURE 2) are formed in silicon oxide coating 13, thus exposing predetermined portions of wafer face 11. The exact size and shape of openings 15 and 16 is not critical. The openings may have regular shapes such as polygons or circles, or may be irregular in shape. The openings may be equal or unequal in area, but preferably the distance between them should be less than 1 mil. In this example, the openings 15 and 16 are each 10 mils long, 3 mils wide, and spaced 0.3 mil apart along their 10 mil length. The openings or apertures 15 and 16 in silicon oxide coating 13 may be made by depositing an acid resist (not shown) such as paraffin wax or apiezon wax on predetermined portions of silicon oxide layer 13, and over all of silicon oxide layer 14, then removing the exposed portions of silicon oxide layer 13 with an etchant such as a hydrofluoric acid solution. The acid resist is then removed with a suitable solvent prior to the subsequent diffusion step.

A conductivity modifier or impurity of a type opposite to that of wafer 10 is now diffused by openings 15 into those portions of wafer face 11 which are exposed and 16. In this example, the conductivity modifier used is a donor such as arsenic, antimony, phosphorus or the like. The donor-diffused regions 17 and 18 thus formed immediately adjacent wafer face 11 are of low resistivity and of N-type conductivity. The diffusion is accomplished under such conditions of impurity source concentration and heating profile that the concentration of charge carriers (electrons in this example) at the surface of diffused regions 17 and 18 is at least $10^{19}$ per cm.$^3$. This concentration decreases with increasing depth, and the donor-diffused regions 17 and 18 are less than 1 mil thick in this example. The size and shape of the donor-diffused regions 17 and 18 correspond to the size and shape of openings 15 and 16 respectively. P–N junctions 19 and 20 respectively are formed at the boundaries or interface between the N-type donor-diffused regions 17 and 18 respectively and the P-type bulk of silicon wafer 10.

Figure 3:
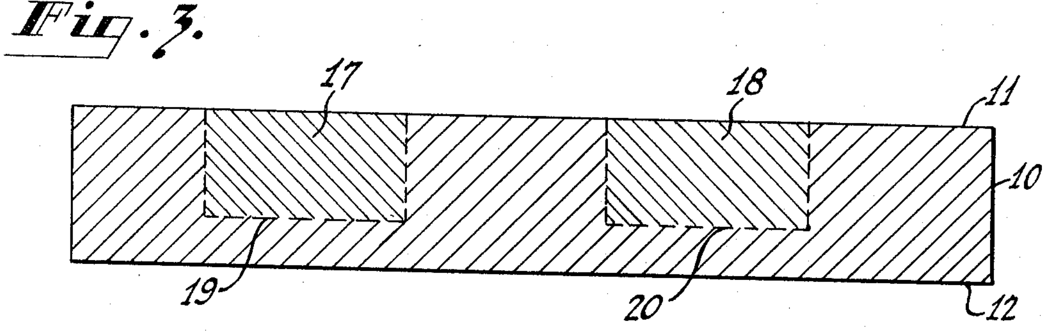

The remaining portions of silicon oxide layer 13 and all of silicon oxide layer 14 are now removed, leaving the wafer 10 as in FIGURE 3.

Silicon wafer 10 is now reheated in steam for about 30 minutes at about 1000° C. to form fresh silicon oxide layers 23 and 24 (FIGURE 4) on major wafer faces 11 and 12 respectively. Using masking and etching techniques known to the art, an opening 25 is made in silicon oxide coating 23 so as to expose a portion of wafer face 11. The opening 25 completely surrounds the lateral periphery of one donor-diffused low-resistivity region 18, but preferably is spaced from said region 18. In this example, a portion of opening 25 exposes a portion of the other low-resistivity region 17, including that edge of the other region 17 which is closest to low-resistivity region 18. An acceptor such as boron, aluminum, gallium, or indium is now diffused into the portion of wafer face 11 exposed by opening 25 to form an acceptor-diffused zone or band 27 completely surrounding the lateral periphery of donor-diffused region 18, and spaced therefrom. A portion of the acceptor-diffused zone 27 is immediately adjacent a portion of the other donor-diffused region 17. This diffusion step is accomplished under such conditions of source concentration and heating profile that the concentration of charge carriers (holes) at the surface of the acceptor-diffused zone 27 is less than the concentration of charge carriers (electrons) at the surface of N-type regions 17 and 18, and advantageously is about $1\times10^{17}$ to $5\times10^{18}$ charge carriers per cm.$^3$. The concentration of charge carriers in the peripheral zone 27 is thus made less than the concentration of charge carriers in the two spaced regions 17 and 18. The boundary 29 between this acceptor-diffused zone 27 and the bulk of P-type wafer 10 is a $P^+$–P junction. The portion 27' of the acceptor-diffused zone 27 which lies within the donor-diffused region 17 remains N-type, since the concentration of negative charge carriers (electrons) in this region 17 as a result of the previous donor diffusion is considerably greater than the concentration of positive charge carriers (holes) introduced by this acceptor diffusion into zone 27.

Figure 5:
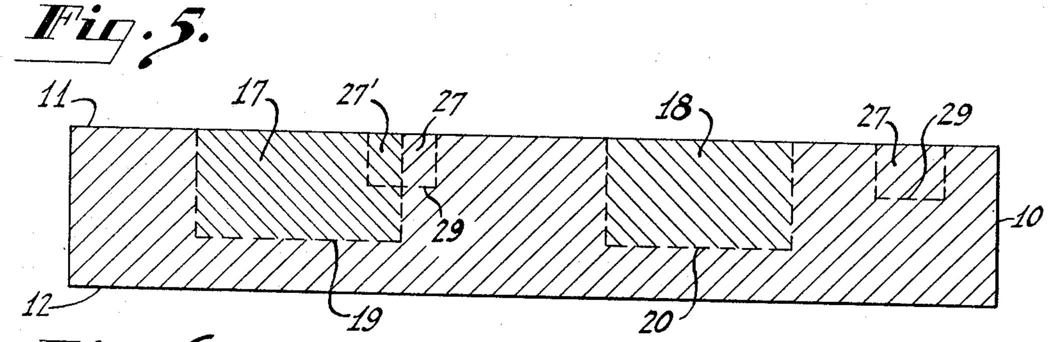

Wafer 10 is now treated in an etchant containing hydrofluoric acid so as to completely remove oxide layers 23 and 24, leaving the wafer as in FIGURE 5.

Figure 6:
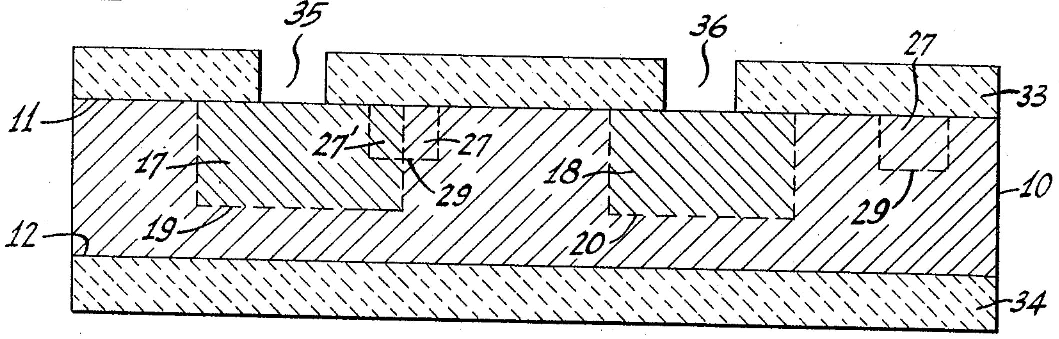

Wafer 10 is reheated in dry oxygen or dry air to form clean new silicon oxide coatings 33 and 34 respectively (FIGURE 6) on faces 11 and 12 of wafer 10. Two spaced openings or apertures 35 and 36 are now formed in silicon oxide coating 33 by any convenient method, for example, by the masking and etching techniques previously mentioned. One opening 35 is formed entirely within one low-resistivity region 17, and the other opening 36 is formed entirely within the other low-resistivity region 18. If an acid resist has been utilized, it is removed by means of a suitable solvent prior to the next step.

Figure 7:
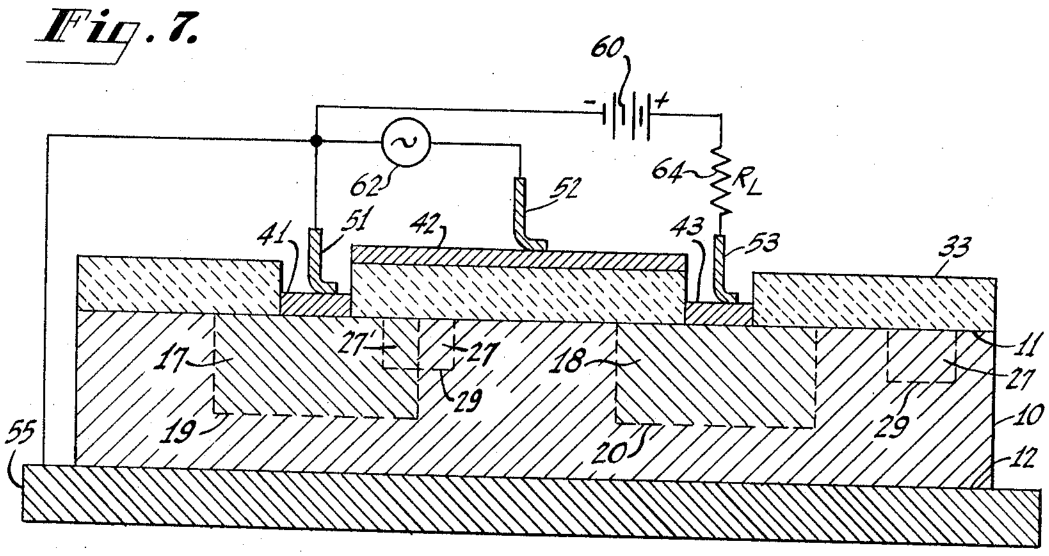
Figure 8:
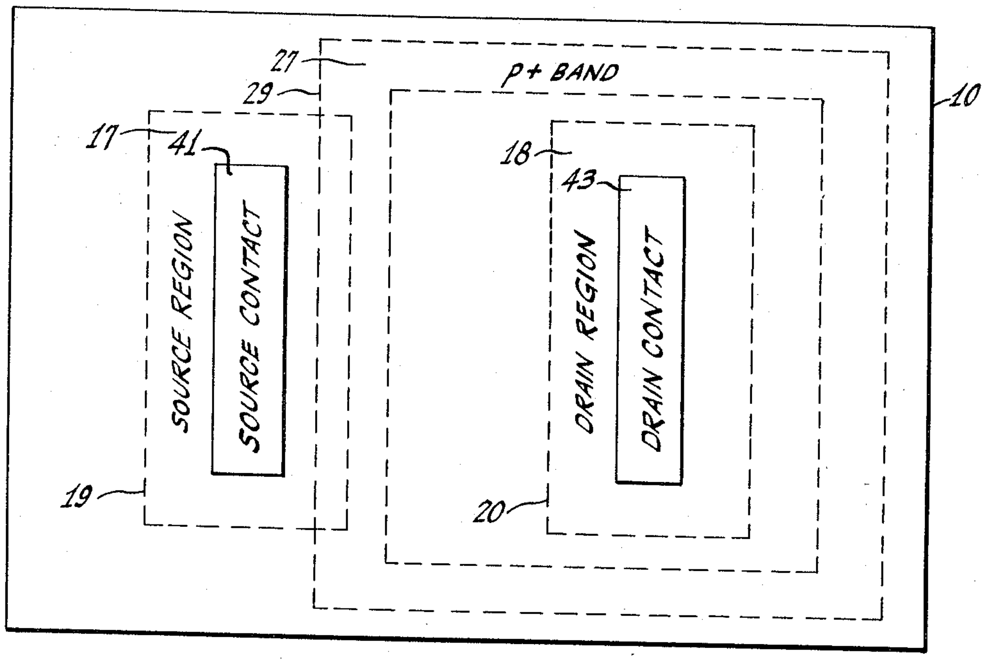
FIGURE 8 is a plan view of the semiconductor device in one stage in its fabrication.

Referring now to FIGURE 7, a metal such as aluminum, palladium, chromium, rhodium or the like is deposited by any convenient method, for example, by evaporation through a mask, on the exposed portions of wafer regions 17 and 18. One metallic contact or electrode 41 is thus formed to wafer region 17, and another metallic contact or electrode 43 to region 18. FIGURE 8 is a plan view of face 11 of wafer 10 at this stage. The silicon oxide layer 33 which covers all of wafer face 11, except for the portions where electrodes 41 and 43 have been deposited, is not shown in FIGURE 8 for greater clarity. A third metallic contact 42 is deposited on the silicon oxide layer 33 over the gap between regions 17 and 18. The three metallic contacts or electrodes 41, 42 and 43 may be deposited simultaneously by evaporation through a mask, or by coating the entire top of the wafer and removing the undesired portions of the metal with an etchant.

In operation, contacts 41 and 43 serve as the source and drain electrodes, respectively, while contact 42 serves as the control or gate electrode of the device. Electrical leads 51, 52 and 53 may be attached to electrodes 41, 42 and 43 respectively. Conveniently, lead wires 51, 52 and 53 are gold wires attached to the electrodes 41, 42 and 43 by thermocompression bonding. The semiconductive body 10 is conveniently mounted with major face 12 down on a metallic header 55. The unit may then be encapsulated and cased by standard techniques known to the semiconductor art.

The device of this example may be operated as follows. Leads 51 and 53 are utilized as the source and drain leads, respectively, while lead 52 is the control or gate lead. Die face 12 and source lead 51 are electrically connected to each other via header 55. Drain lead 53 is positively biased by a source of direct current potential such as a battery 60, so that the drain electrode or contact 43 and the drain region 18 of the device are also poled positive with respect to the source region 17 and the source electrode 41. A source 62 of signal potential is connected between the gate lead 52 and the source lead 51. The electrical load, shown as a resistance 64, is connected between the positive pole of battery 60 and the drain lead 53. A signal input on gate lead 52 results in an amplified signal output developed across the load resistor 64.

Figure 9A:
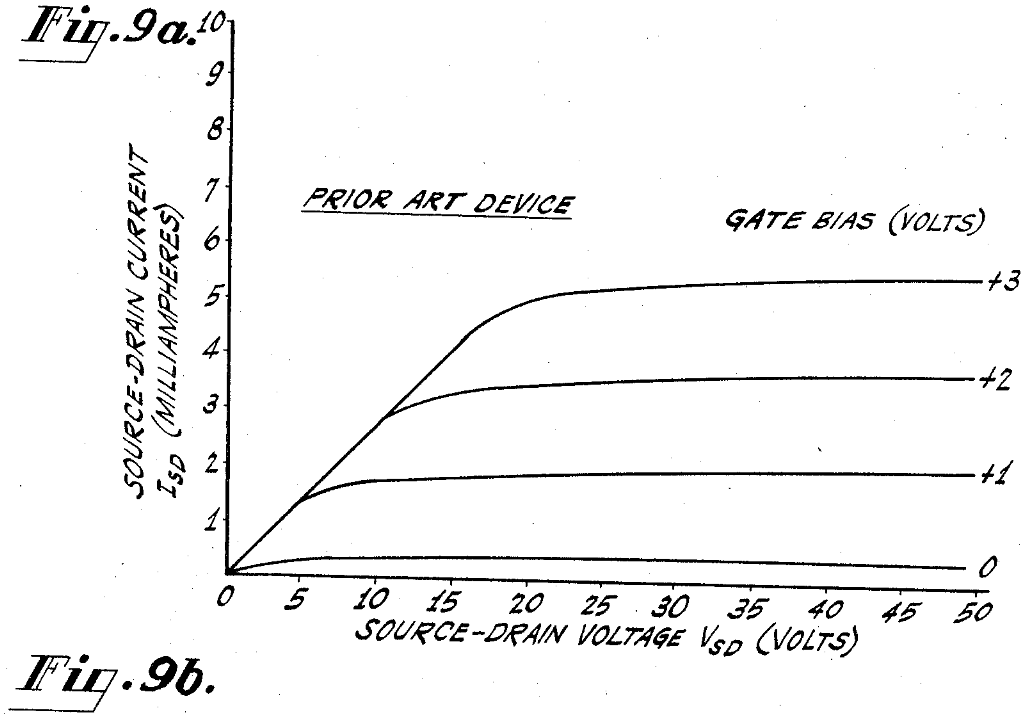
FIGURES 9*a* and 9*b* are plots of the electrical characteristics of a comparable prior art device and of a device according to the invention respectively, showing the characteristic variation in source-drain current with source-drain voltage for different values of gate bias.
Figure 9B:
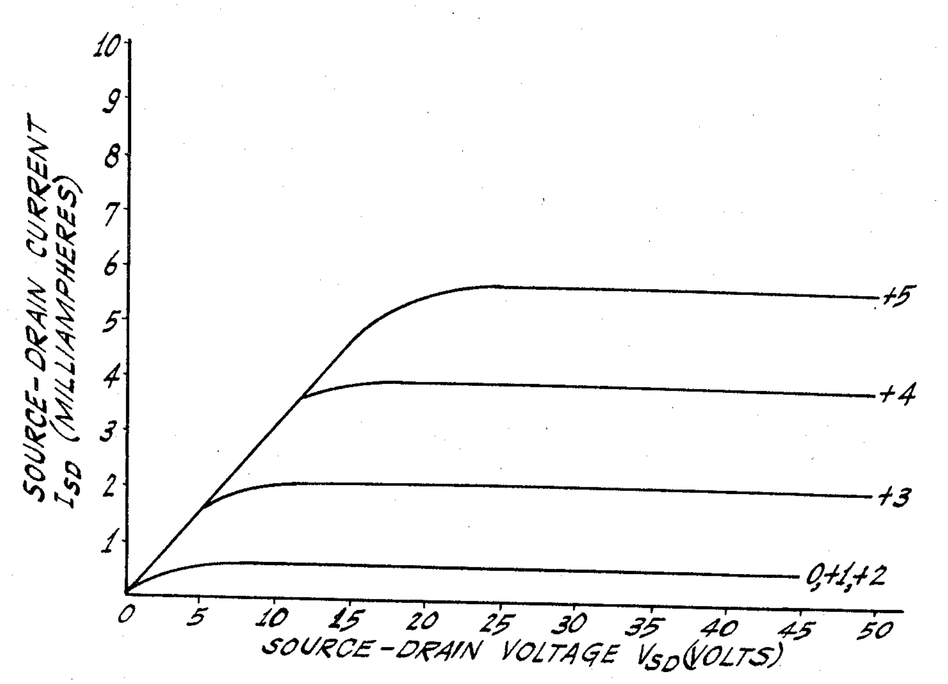

The electrical characteristics of an insulated-gate field-effect device according to this example are plotted in FIGURE 9*b*. When the gate bias is zero, only a small leakage current flows between the source and drain regions of the device. As the gate bias is increased to one volt, and further increased to two volts, the source-drain current remains small, and is practically unchanged from the source-drain leakage current at zero bias. However, when the gate bias reaches a particular threshold value, which in this example is about three volts, then a substantial current begins to flow between the source and drain regions of the device. Devices having such threshold values may be utilized in certain types of circuits to obtain a measure of noise immunity. For comparison, the electrical characteristics of a similar device according to the prior art are recorded in FIGURE 9*a*. This prior art device does not have the $P^+$ zone or band 27 around the drain region 18, but is otherwise similar to the device of this example. It will be noted that the prior art device does not exhibit any threshold value. At zero bias, a small leakage current flows between the source and drain of this unit. However, a positive gate bias of only one volt is sufficient to permit substantial source-drain current to flow, and this source-drain current increases as the gate bias increases.

A feature of devices according to the invention is that their threshold value (the minimum value of gate bias which will permit a substantial source-drain current) can be adjusted by changing the conductivity of the peripheral band or zone 27 around one spaced low conductivity region 18. It is theorized that in insulated-gate field-effect devices having N-type source and drain regions, as in this example, it is necessary for the positive bias on the gate electrode to attract sufficient negative carriers to the P-type wafer surface beneath the gate electrode so as to invert the conductivity of this portion of the wafer surface, and thus form an N-type channel through which current can flow between the N-type source and drain regions. In the device of this example, it is believed that the presence of the P+ zone or band 27 in the wafer between the source and drain regions 17 and 18 makes it difficult to invert the conductivity of the wafer surface between the source and drain regions, and thus introduces the threshold effect which can be seen in FIGURE 9*b*. The threshold gate voltage is the voltage required to invert the conductivity of the surface of zone 27. The more heavily doped the peripheral zone 27, the greater the gate voltage has to be before current can flow between the source and drain regions. However, the invention can be practiced without depending on a particular theoretical explanation for the observed effect.

It will be noted that the device of this example was operated so that the given type low-resistivity region 18 which was surrounded by opposite type zone or band 27, was utilized as the drain region. The circuit connections may be interchanged so that region 18 becomes the source region, and region 17 becomes the drain region of the device. The opposite type zone or band 27 will then surround the lateral periphery of the source region. In this mode of operation, the device will still exhibit improved electrical characteristics, including a threshold voltage. However, it is presently preferred that the low-resistivity region 18 which is surrounded by the opposite type zone 27 be utilized as the drain region of the device. When the zone 27 is around the drain region as in this embodiment, and the conductivity of the wafer surface beneath the gate electrode is inverted by the applied gate voltage, the zone or band 27 cuts off the inversion layer at the inner boundary of the zone, and also reduces surface leakage. When the zone 27 is around the source region, the source-to-drain channel is cut, but surface leakage is not decreased.

Another feature of devices fabricated according to the invention is that a wide variety of metals and alloys such as palladium, rhodium, gold, chromium, aluminum and the like may be used as the electrode materials. In similar prior art devices, the characteristics of a unit with aluminum as the electrode material appear to differ from the characteristics of similar devices using chromium alloys as the electrode material in that the devices with aluminum electrodes have a higher channel current at zero gate bias than the comparable devices with chromium electrodes.

It has unexpectedly been found that by using the methods described, satisfactory insulated-gate field-effect enhancement transistors may be made of both P-type and N-type on the same semiconductive wafer. It is believed that this result is due to the feature mentioned above, i.e., the electrical characteristics of devices according to the invention may be controlled by varying the charge carrier concentration in the low-resistive zone around the lateral periphery of the source or drain region.

Another advantage of devices according to the invention is that the output impedance of the unit seems to be increased as compared to similar prior art units. The reason for this increase is not presently clear.

*Example II*

In the previous example, the source and drain regions were N-type regions in a P-type semiconductive wafer, and the wafer zone or band formed around the lateral periphery of the drain region was also P-type. In this example, the source and drain regions are P-type regions in an N-type semiconductive wafer, and the wafer zone or band formed around the lateral periphery of the drain region is N-type.

Referring now to FIGURE 1, a semiconductive body or wafer 10 consisting of N conductivity type monocrystalline silicon-germanium alloy is prepared in the form of a die having two opposing major faces 11 and 12. Suitable monocrystalline silicon-germanium alloys are, e.g., described in U.S. Patent 2,997,410 issued August 22, 1961 to B. Selikson, and assigned to the assignee of this application. Masking layers 13 and 14 are provided on major die faces 11 and 12 respectively. The masking layers 13 and 14 may consist of silicon oxide deposited on die 11 by thermally decomposing an organic siloxane compound, and forcing the decomposition products through a jet so as to impinge upon and coat the die, as described, e.g., in U.S. Patent 3,114,663, issued December 17, 1963 to J. Klerer, and assigned to the assignee of this application.

Two spaced openings or apertures 15 and 16 (FIGURE 2) are formed in one masking layer 13. The openings 15 and 16 may be made by the masking and etching techniques mentioned above. Alternatively, precision photolithographic techniques known to the semiconductor art may be employed for this purpose, utilizing a photoresist which may be a bichromated protein such as bichromated gum arabic, bichromated gelatin, and the like, or a commercially available photoresist. The conductivity modifier is now diffused into the exposed portions of die face 11 to form two spaced low-resistivity regions 17 and 18. In this example, since the die is N-type, the conductivity modifier is one which is an acceptor in the particular semiconductor utilized. Suitable acceptors for the silicon-germanium alloys are boron, aluminum, gallium and indium. Masking layers 13 and 14 are then removed, leaving the die 10 as in FIGURE 3.

Fresh masking layers 23 and 24 (FIGURE 4) are deposited on die faces 11 and 12 respectively. Using the photolithographic techniques mentioned above, an opening or aperture 25 is made in masking layer 23 so as to expose a portion of die face 11. The opening 25 completely surrounds the lateral periphery of one low-resistivity region 18, but preferably is spaced from said region 18. Suitably, a portion of opening 25 may expose a portion of the other law-resistivity region 17, including that edge of the other low-resistivity region 17 which is closest to region 18. A conductivity modifier of type opposite to that of low-resistivity regions 17 and 18, which in this example is a donor such as phosphorous, arsenic and antimony, is diffused into the portion of die face 11 exposed by aperture 25 so as to form a donor-diffused zone or band 27 immediateley adjacent die face 11 and completely surrounding the lateral periphery of low-conductivity region 18, but spaced therefrom. The precise depth of donor-diffused region 27 is not critical, and may be less than, or equal to, or greater than the depth of low-resistivity regions 17 and 18. However, the parameters of impurity source concentration, and diffusion heating profile are arranged so that the concentration of charge carriers (holes in this example) in the spaced low-resistivity regions 17 and 18 is greater than the concentration of charge carriers (electrons in this example) in the donor-diffused zone 27. Thus the portion 27′ of zone 27 which lies within the acceptor-diffused region 17 remains P-type.

The masking layers 23 and 24 are removed, leaving the die 10 as in FIGURE 5. Fresh masking layers 33 and 34 (FIGURE 6) of dielectric material such as silicon oxide are deposited on die faces 11 and 12 respectively. Two spaced openings or apertures 35 and 36 are formed in dielectric layer 33 by an convenient method, for example, by the photolithographic techniques mentioned above. One opening 25 is entirely within one low-resistivity region 17, and the other opening 36 is entirely within the other low-resistivity region 18.

Referring now to FIGURE 7, a metal such as aluminum, palladium, chromium, or the like, is deposited by any convenient method on the exposed portions of die face 11 to form a metallic electrode or contact 41 to wafer region 17, and another metallic electrode to wafer region 18. A third metallic contact 42 is deposited on the portion of dielectric layer 43 over the gap between the spaced low-resistivity regions 17 and 18. Electrical lead wires 51, 52 and 53 are attached to electrodes 41, 42 and 43 respectively. Conveniently, the semiconductive body or wafer 10 is mounted with major face 12 down on a metallic header 55. The unit may then be encapsulated and cased by standard techniques. In the operation of the device of this example, electrode 41 suitably serves as the source electrode, electrode 42 as the gate electrode, and electrode 43 as the drain electrode. However, since the source and drain regions 17 and 18 are P-type in the device of this example, the polarities of the voltages applied to the device electrodes are the reverse of those described in connection with those of Example I.

*Example III*

In the previous examples, the source and drain regions were formed in the semiconductive wafer before the conductive zone was formed around the lateral periphery of the drain region. In this example, the conductive zone is formed in the semiconductive wafer before the source and drain regions are formed.

Figure 4:
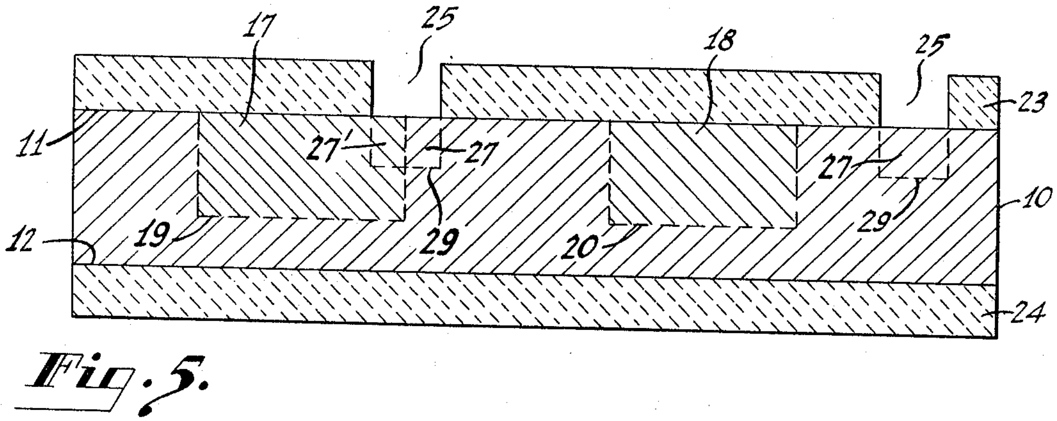

Referring now to FIGURE 4, a crystalline semiconductive wafer 10 is prepared as a die with two opposing major faces 11 and 12. In this example, the die 10 consists of given conductivity type monocrystalline germanium. Masking layers 23 and 24 are deposited on major die faces 11 and 12 respectively. The masking layers may for example consist of dielectric silicon oxide formed by thermal decomposition of an organic siloxane compound, as mentioned in Example II.

Figure 2:
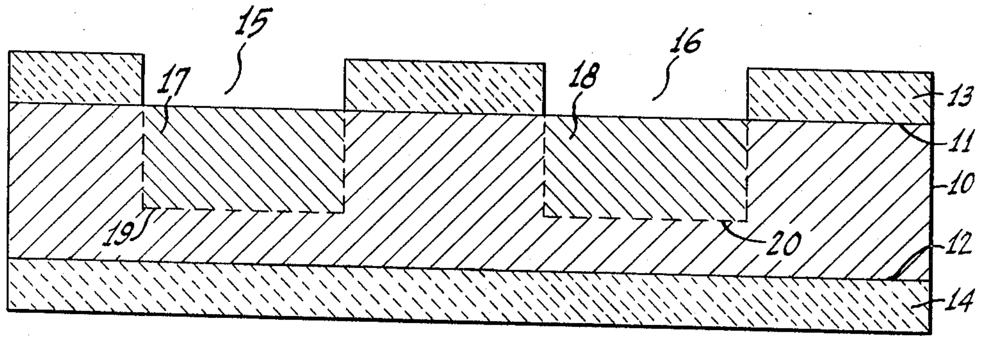

An aperture or opening 25 is formed in one masking layer 23. The periphery of aperture 25 is in the form of a closed plane figure, and may for example be square or rectangular or circular in plan view. A conductivity modifier which induces the same conductivity type as that of the die 10 is now diffused into the exposed portion of die face 11 to form a zone 27 which is of the same conductivity type but greater conductivity than the rest of the die 10. The old masking layers 23 and 24 are removed, and fresh masking layers such as layers 13 and 14 in FIGURE 2 are deposited on die faces 11 and 12 respectively. A pair of spaced openings 15 and 16 are formed in masking layer 13 so that one opening 16 is completely within the closed curve formed by zone 27. A conductivity modifier of type opposite to that of the die is then diffused into the exposed portions of die face 11 to form the low-resistivity source and drain regions 17 and 18. The remaining fabrication steps, including the deposition of metallic electrodes, the attaching of lead wires to the aforesaid electrodes, and the casing of the device, are similar to those described above in connection with Example I.

It will be understood that the embodiments described above are by way of illustration and explanation only, but not limitation. Other crystalline semiconductive materials may be utilized, with appropriate acceptors and donors in each case. Other metals or alloys may be utilized for the electrodes, and may be deposited by other techniques such as sputtering or electroless plating. The closed plane figure formed by the conductive zone of the drain region of the device need not be regular in shape. Various other modifications may be made without departing from the spirit and scope of the invention as described in the specification and appended claims.

What is claimed is:

1. An insulated-gate field-effect semiconductor device comprising:
- a crystalline semiconductive body of given conductivity type having at least one major face;
- first and second spaced low-resistivity regions of opposite conductivity type in said body immediately adjacent said one major face;
- first and second metallic contacts on said one major face connected respectively to said first and second spaced regions;
- a low-resistivity zone of said given conductivity type in said body immediately adjacent said one major face and surrounding the lateral periphery of only one of said spaced regions;
- a layer of dielectric material on said one major face covering the gap between said first and second spaced regions; and,
- a metallic contact on said dielectric layer over said gap.

2. An insulated-gate field-effect semiconductor device comprising:
- a crystalline semiconductive body of given conductivity type having at least one major face;
- first and second spaced low-resistivity regions of opposite conductivity type in said body immediately adjacent said one major face;
- first and second metallic contacts on said one major face connected respectively to said first and second spaced regions;
- a low-resistivity zone of said given conductivity type in said body immediately adjacent said one major face, said zone surrounding the lateral periphery of only one of said low-resistivity regions but spaced therefrom, a portion of said zone being immediately adjacent a portion of the other said low-resistivity region;
- a layer of dielectric material on said one major face covering the gap between said first and second spaced regions, and,
- a metallic contact on said dielectric layer over said gap.

3. An insulated-gate field-effect semiconductor device comprising:
- a crystalline semiconductive body of given conductivity type having at least one major face;
- first and second spaced low-resistivity regions of opposite conductivity type in said body immediately adjacent said one major face;
- first and second metallic contacts on said one major face connected respectively to said first and second spaced regions;
- a low-resistivity zone of said given conductivity type in said body immediately adjacent said one major face and surrounding the lateral periphery of only one of said spaced regions, the concentration of charge carriers in said zone being less than the concentration of charge carriers in said spaced region;
- a layer of dielectric material on said one major face covering the gap between said first and second spaced regions; and
- a metallic contact on said dielectric layer over said gap.

4. An insulated-gate field-effect semiconductor device comprising:
- a crystalline semiconductive body of given conductivity type having at least one major face;
- first and second spaced low-resistivity regions of opposite conductivity type in said body immediately adjacent said one major face;
- first and second metallic contacts on said one major face connected respectively to said first and second spaced regions;
- a low-resistivity zone of said given conductivity type in said body immediately adjacent said one major face, said zone surrounding the lateral periphery of one said region but spaced therefrom, a portion of said zone being immediately adjacent a portion of the other low-resistivity region, the concentration of charge carriers in said zone being less than the concentration of charge carriers in said regions;

a layer of dielectric material on said one major face covering the gap between said first and second spaced regions; and, a metallic contact on said dielectric layer over said gap.

5. An insulated-gate field-effect device comprising:

a crystalline silicon body of given conductivity type having at least one major face;

first and second spaced low-resistivity regions of opposite conductivity type in said body immediately adjacent said one major face;

first and second metallic contacts on said one major face connected respectively to said first and second spaced regions;

a low-resistivity zone of said given conductivity type in said body immediately adjacent said one major face and surrounding the lateral periphery of only one of said regions, the concentration of charge carriers in said zone being less than the concentration of charge carriers in said region;

a layer of silicon oxide on said one major face covering the gap between said first and second spaced regions; and, a metallic contact on said silicon oxide layer over said gap.

6. An insulated-gate field-effect device comprising:

a crystalline silicon body of given conductivity type having at least one major face;

first and second spaced low-resistivity regions of opposite conductivity type in said body immediately adjacent said one major face;

first and second metallic contacts on said one major face connected respectively to said first and second spaced regions;

a low-resistivity zone of said given conductivity type in said body immediately adjacent said one major face and surrounding the lateral periphery of one said region but spaced therefrom, a portion of said zone being immediately adjacent a portion of the other said region, including that edge of said other region which is closest to said one region, the concentration of charge carriers in said zone being less than the concentration of charge carriers in said regions;

a layer of silicon oxide on said one major face covering the gap between said first and second spaced regions; and, a metallic contact on said silicon oxide layer over said gap.

References Cited by the Examiner

UNITED STATES PATENTS

| | | | |
|---|---|---|---|
| 2,900,531 | 8/1959 | Wallmark | 317—234 |
| 3,102,230 | 8/1963 | Kahng | 317—234 |
| 3,183,128 | 5/1965 | Leistiko et al. | 317—234 |
| 3,202,840 | 8/1965 | Ames | 317—235 |
| 3,206,670 | 9/1965 | Atalla | 317—234 |
| 3,226,611 | 12/1965 | Haenichen | 317—235 |
| 3,226,613 | 12/1965 | Haenichen | 317—235 |

FOREIGN PATENTS

| | | |
|---|---|---|
| 1,037,293 | 4/1953 | France. |

OTHER REFERENCES

IBM Technical Disclosure Bulletin, "An And Gate Using Single FET," by Brennemann et al., June 1964, vol. 7, No. 1, page 7.

Motorola Silicon Epitaxial Band-Guard Transistors, "Why the Annular Process" by Motorola Semiconductor Products Inc., July 1963, entire publication relied on.

JOHN W. HUCKERT, *Primary Examiner.*

J. D. CRAIG, *Assistant Examiner.*